United States Patent
Luo et al.

[11] Patent Number: 6,150,213
[45] Date of Patent: Nov. 21, 2000

[54] METHOD OF FORMING A COB DRAM BY USING SELF-ALIGNED NODE AND BIT LINE CONTACT PLUG

[75] Inventors: Hung-Yi Luo, Taipei; Erik S. Jeng; Yue-Feng Chen, both of Hsinchu, all of Taiwan

[73] Assignee: Vanguard International Semiconductor Corporation, Hsinchu, Taiwan

[21] Appl. No.: 09/111,685

[22] Filed: Jul. 8, 1998

[51] Int. Cl.$^7$ ............................................... H01L 21/8242
[52] U.S. Cl. ........................ 438/253; 438/265; 437/257; 257/400
[58] Field of Search .................... 438/253, 265; 437/257; 257/400

[56] References Cited

U.S. PATENT DOCUMENTS

| | | | |
|---|---|---|---|
| 5,126,280 | 6/1992 | Cha et al. | 437/52 |
| 5,150,276 | 9/1992 | Gonzalez et al. | 361/313 |
| 5,229,314 | 7/1993 | Okudaira et al. | 437/52 |

*Primary Examiner*—Richard Elms
*Assistant Examiner*—Pho Luy
*Attorney, Agent, or Firm*—Christensen O'Connor Johnson Kindness PLLC

[57] ABSTRACT

The present invention includes forming polysilicon plugs between the gate structures and word lines in a BPSG layer formed on the gate structures and the word lines. A polysilicon layer, a tungsten silicide layer and a silicon oxide layer are sequentially formed on the BPSG layer. Then, the multi-layers are etched to the surface of the BPSG layer. Next, the BPSG layer is slightly etched to expose the polysilicon plug. Oxide spacers are formed on the sidewalls of the layers. A silicon nitride layer is formed over the bit lines, oxide spacers and on the polysilicon plugs. An oxide layer is formed on the silicon nitride layer. Subsequently, the oxide layer is patterned to form node contact holes. An etching is used to etch the silicon nitride layer. A first conductive layer is formed along the surface of the oxide layer, the contact holes. The top portion of the first conductive layer is removed. The oxide layer is removed to expose the silicon nitride layer. A dielectric film is deposited along the surface of the first conductive layer. Finally, a second conductive layer is formed over the dielectric film.

18 Claims, 5 Drawing Sheets

METHOD OF FORMING A COB DRAM BY USING SELF-ALIGNED NODE AND BIT LINE CONTACT PLUG

FIELD OF THE INVENTION

The present invention relates to a semiconductor process and, more specifically, to a method of forming dynamic random access memories (DRAMs).

BACKGROUND OF THE INVENTION

Semiconductor Dynamic Random Access Memory (DRAM) devices have many memory cells. Indeed, a memory cell is provided for each bit stored by a DRAM device. Each memory cell typically consists of a storage capacitor and an access transistor. Either the source or drain of the access transistor is connected to one terminal of the capacitor. The other side of the transistor and the transistor gate electrode are connected to external connection lines called a bit line and a word line, respectively.

In the recent years, there has been increasing density in semiconductor devices leading to decreased size. Each bit of data is stored in a capacitor of a memory cell. Thus, as the DRAMs are scaled down in dimensions, it is a challenge to maintain a sufficiently high stored charge per capacitor. If conventional planar capacitors are used, as the memory cells decrease in size, the area of the capacitors also decrease, resulting in a reduction of cell capacitance. For very small memory cells, planar capacitors become very difficult to use reliably. Further, this results in the capacitor being very susceptible to α particle interference. Additionally, as the capacitance decreases, the charge held by storage capacitor must be refreshed often.

Thus, for DRAMs, there have been disclosed various structures suitable for miniaturization of the device. Both a trench capacitor formed in a substrate and a stacked capacitor formed over a substrate are being used for DRAM application. The stacked memory cell in which the storage node is formed above a silicon substrate is suitable for high density integrated circuits. Further, the shape of the capacitor can be controlled to increase the capacitance without increasing the area it occupies the substrate. It also exhibits the advantages of being less likely to cause soft errors. However, the trench capacitor is susceptible to the well-known leakage problem. This makes the stacked capacitor very popular for making the DRAMs.

Prior art approaches to overcome these problems have resulted in the development of capacitors having roughened surfaces forming the electrodes. See, for example, M. Sakao et I., "CAPACITOR-OVER-BIT-LINE (COB) CELL WITH A HEMISPHERICAL-GRAIN STORAGE NODE FOR 64 Mb DRAM" in IEDM 1990 technical digest pp. 655–658. In U.S. Pat. No. 5,278,091 to P. Fazan, Fazan proposed a crown stacked capacitor with HSG (HemiSpherical Grain) rugged polysilicon on storage node.

In general, the HSG-Si is deposited by low pressure chemical vapor deposition method at the transition temperature from amorphous Si to polycrystalline Si. This memory cell provides large storage capacitance by increasing the effective surface area of a simple storage node. The HSG-Si storage node can be fabricated by addition of two process steps, i.e., HSG-Si deposition and an etchback step. A further HSG-Si electrode node has been proposed, please refer to "NEW CYLINDRICAL CAPACITOR USING HEMI-SPHERICAL GRAIN Si FOR 256 Mb DRAMs", H. Watanabe et 1., microelectronics research laboratories, NEC Corporation.

SUMMARY OF THE INVENTION

The present invention provides capacitors with an enlarged surface area. The present invention uses the high etching selectivity between oxide and nitride to fabricate the capacitor. A method for manufacturing a crown shaped capacitor is disclosed. The method comprises the steps of forming polysilicon plugs between the gate structures and word lines in a boro-phosphosilicate-glass (BPSG) layer formed on the gate structures and the word lines. Multi-layers, including a third polysilicon layer, a tungsten silicide layer and a silicon oxide layer are sequentially formed on the dielectric layer.

A polysilicon layer is formed over and in the contact hole and on the BPSG layer to act as bit line. Then, the multi-layers are respectively patterned to the surface of the BPSG layer. Next, the BPSG layer is slightly etched to expose the polysilicon plug between the gate structure and the word line. Oxide spacers are formed on the sidewalls of the multi-layers to isolate the bit lines. A silicon nitride layer is formed over the bit lines, oxide spacers and on the polysilicon plugs. An oxide layer is formed on the silicon nitride layer.

Subsequently, the oxide layer is patterned to form node contact holes. An etching step is used to etch the silicon nitride layer with highly selective etching between the silicon oxide and silicon nitride, thereby generating nitride spacers on the oxide spacers.

A first conductive layer is formed along the surface of the oxide layer, the contact holes and the oxide spacers, nitride spacers. The top portion of the first conductive layer is removed by chemical mechanical polishing (CMP) or etching back. The oxide layer is removed to expose the silicon nitride layer. A dielectric film is deposited over the surface of the first conductive layer and silicon nitride layer. Finally, a second conductive layer is formed over the dielectric film.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The formation of the crown shape capacitor described herein includes many process steps that are separately well known in the art but that have not heretofore been combined as in the invention. For example, the processes of photolithography masking and etching are well known in the art and are used extensively herein without a detailed discussion of this well-known technology.

At the present, the crown capacitor contact is tending to a polysilicon plug for 0.25 micron process. However, it involves a plurality of photo mask related processes. For the purpose of cost reduction in the next generation of DRAM, the present invention uses SAC (self-aligned contact) structure in the capacitor contact formation for affording the merits of isolation and good DRAM performance. In addition, the SAC process of the present invention is developed by an etching technique having high selectivity to silicon nitride. As will be seen below, this technique can be used to gain larger capacitance and to reduce contact hole etching aspect ratio.

Figure 1:
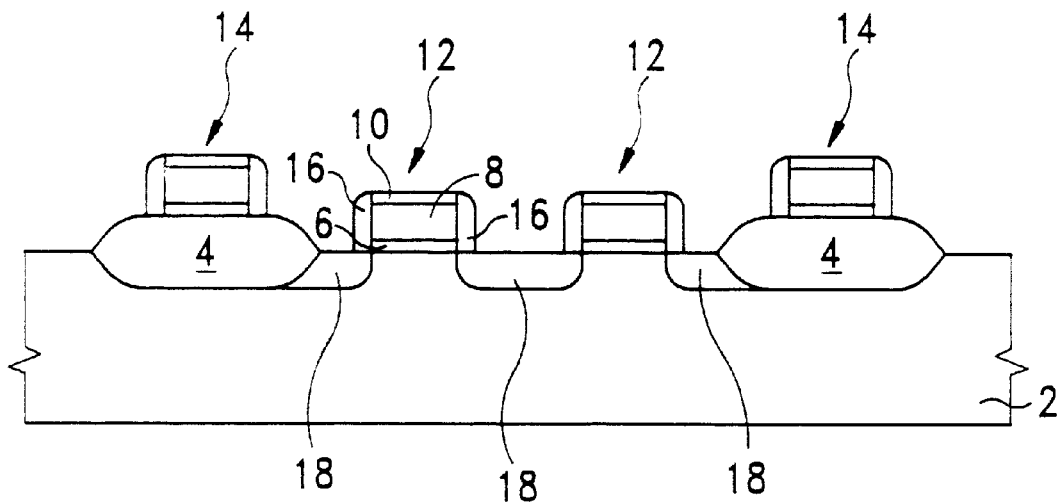
FIG. 1 is a cross sectional view of a semiconductor wafer illustrating the step of forming transistors on a semiconductor substrate.

Referring to FIG. 1, a single crystal silicon substrate 2 with a <100> rystallographic orientation, is provided. A thick field oxide (FOX) region 4 is formed to provide isolation between devices on the substrate 2. The FOX region 4 is created in a conventional manner. For example, the FOX region 4 can be formed via photolithography and dry etching steps to etch a silicon nitride silicon dioxide composition layer. After the photoresist is removed and wet cleaned, thermal oxidation in an oxygen steam environment is used to grow the FOX region 4 to a thickness of about 4000–6000 Angstroms. Then, the composition layer is removed.

Prior to forming the FOX region 4, a silicon dioxide layer 6 is created on the top surface of the substrate 2 to serve as the gate oxide for subsequently formed Metal Oxide Silicon Field Effect Transistors (MOSFETs). In one embodiment, the silicon dioxide layer 6 is formed by using an oxygen steam ambient, at a temperature of about 850–1000 degrees centigrade Alternatively, the oxide layer 6 may be formed using any suitable method, such as chemical vapor deposition. In this embodiment, the thickness of the silicon dioxide layer 6 is approximately 20–200 Angstroms.

A doped polysilicon layer 8 is then formed over the FOX region 4 and the silicon dioxide layer 6 using a LPCVD (Low Pressure Chemical Vapor Deposition) process. In this embodiment, the polysilicon layer 8 has a thickness of about 500–2000 Angstroms. A metal silicide layer is optionally formed on the polysilicon layer 8. A cap layer 10 is then formed over the polysilicon layer 8. The cap layer 10 can be chosen from silicon oxide or silicon nitride. Next, standard photolithography and etching steps are used to form gate structures 12 and word lines 14. Spacers 16 are formed on the sidewalls of the gate structures 12 and word lines 14. In a preferred case, the spacers 16 consist of silicon nitride or oxide and are formed by a conventional anisotripic etching technique. Subsequently, active regions (i.e., the source and the drain) 18 are formed by using wellknown processes to implant appropriate impurities in those regions.

Figure 2:
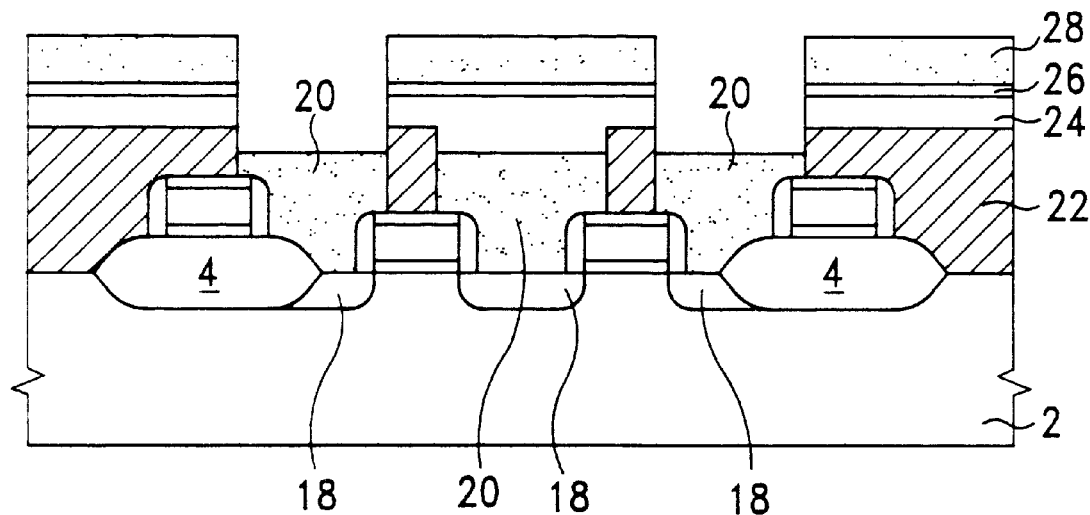
FIG. 2 is a cross sectional view of a semiconductor wafer illustrating the step of patterning multi-layers over the semiconductor substrate.

Turning next to FIG. 2, polysilicon plugs 20 are formed in a dielectric layer 22 formed on the gate structures 12 and the word lines 14 by well-known techniques. The dielectric layer 22 for isolation can be formed by using suitable material such as BPSG (boro-phospho-silicate glass) or TEOS oxide. The polysilicon plugs 20 are formed between the gate structures 12, and between the word lines 14 and the gate structures 12. Multi-layers including a polysilicon layer 24, a tungsten silicide layer 26 and a silicon oxide layer or silicon nitride layer 28 are sequentially formed on the dielectric layer 22. A polysilicon layer 24 is formed over and in the contact hole 23 and on the first dielectric layer 22. The polysilicon layer 24 is preferably formed using conventional low pressure chemical vapor deposition (LPCVD) processing. The polysilicon layer 24 is preferably chosen from doped polysilicon or in situ doped polysilicon.

The polysilicon layer 24 on the dielectric layer 22 acts as bit line of the cell. The silicon oxide layer or silicon nitride layer 28 is used as an isolation cap for the bit line. Then, the multi-layers are respectively patterned by applying a lithography process to the surface of the first dielectric layer 22, as shown in the FIG. 2. Next, the dielectric layer 22 is slightly etched to at least expose the polysilicon plug 20 between the gate structure 12 and the word line 14.

Figure 3:
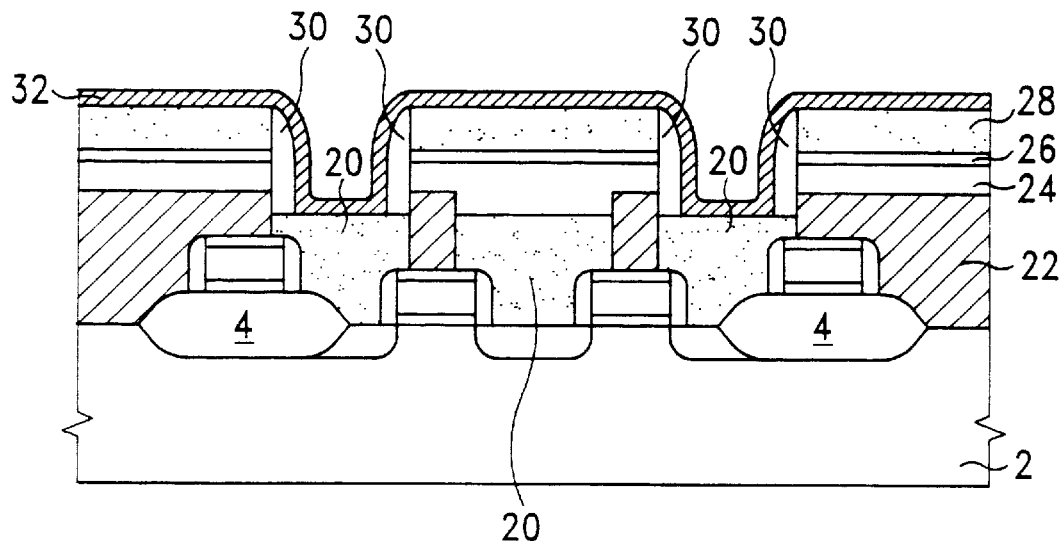
FIG. 3 is a cross sectional view of a semiconductor wafer illustrating the steps of forming oxide spacers and a silicon nitride layer.

As shown in FIG. 3, spacers 30 are formed on the sidewalls of the multi-layers to isolate the bit lines. Preferably, spacers are formed of silicon oxide. As is well-known in the art, they can be formed by depositing and followed by anisotropical etching. A silicon nitride layer 32 is formed over the bit lines, spacers 30 and on the polysilicon plugs 20.

Figure 4:
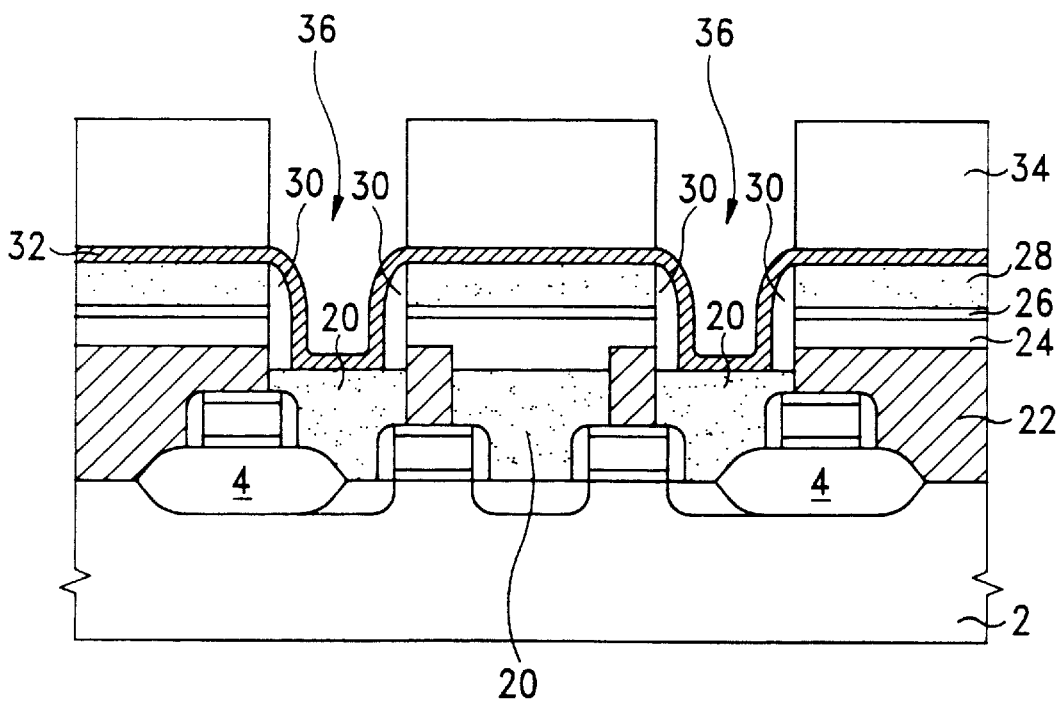
FIG. 4 is a cross sectional view of a semiconductor wafer illustrating the step of forming node contact holes.

Turning now to FIG. 4, a further dielectric layer 34 is formed on the silicon nitride layer 32 with a thickness about 10000 to 20000 angstroms for isolation. The dielectric layer 34 preferably comprises oxide layer. A TEOS oxide layer can be utilized in lieu of the oxide as the dielectric layer 24, if desired. Subsequently, the second dielectric layer 34 is patterned to form node contact holes 36 in the second dielectric layer 34 over the polysilicon plugs formed between the gate structure 12 and the word lines 14.

Figure 5:
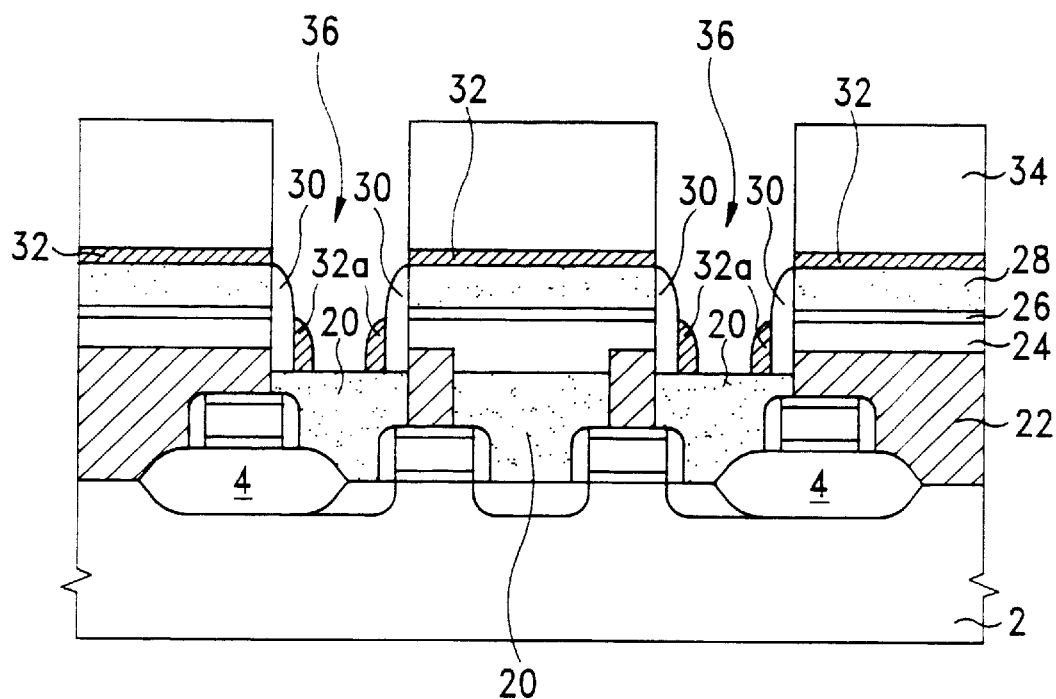
FIG. 5 is a cross sectional view of a semiconductor wafer illustrating the step of etching the silicon nitride layer.

Turning next to FIG. 5, an etching is used to etch the silicon nitride layer 32 exposed by the storage node contact holes 36. The etching is performed with highly selective etching between the silicon oxide and silicon nitride. Preferably, an anisotropical etch is introduced, thereby generating nitride spacers 32a on the oxide spacers 30. As aforementioned, this technique can be used to reduce contact hole etching aspect ratio.

Figure 6:
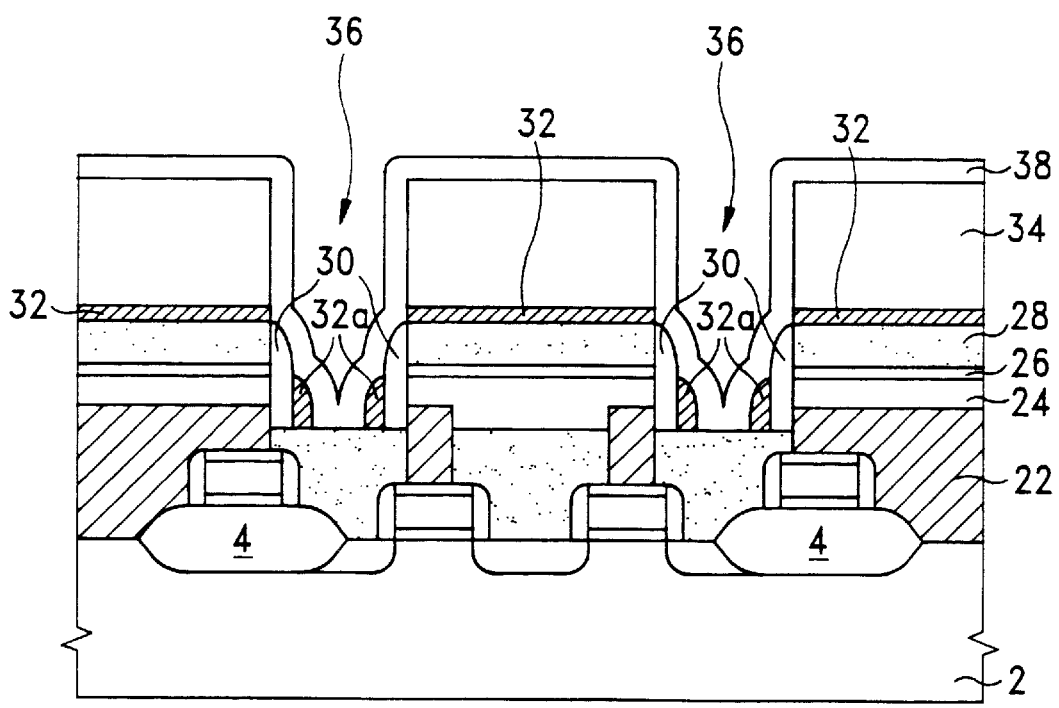
FIG. 6 is a cross sectional view of a semiconductor wafer illustrating the step of forming a first conductive layer.

Next, as seen in FIG. 6, a first conductive layer 38 is formed along the surface of the second dielectric layer 34, the contact holes 36 and the spacers 30, 32a. Typically, the first conductive layer is chosen from a group of metal, alloy or polysilicon. In the preferred embodiment, the doped polysilicon or in-situ doped polysilicon is used as the candidate.

Figure 7:
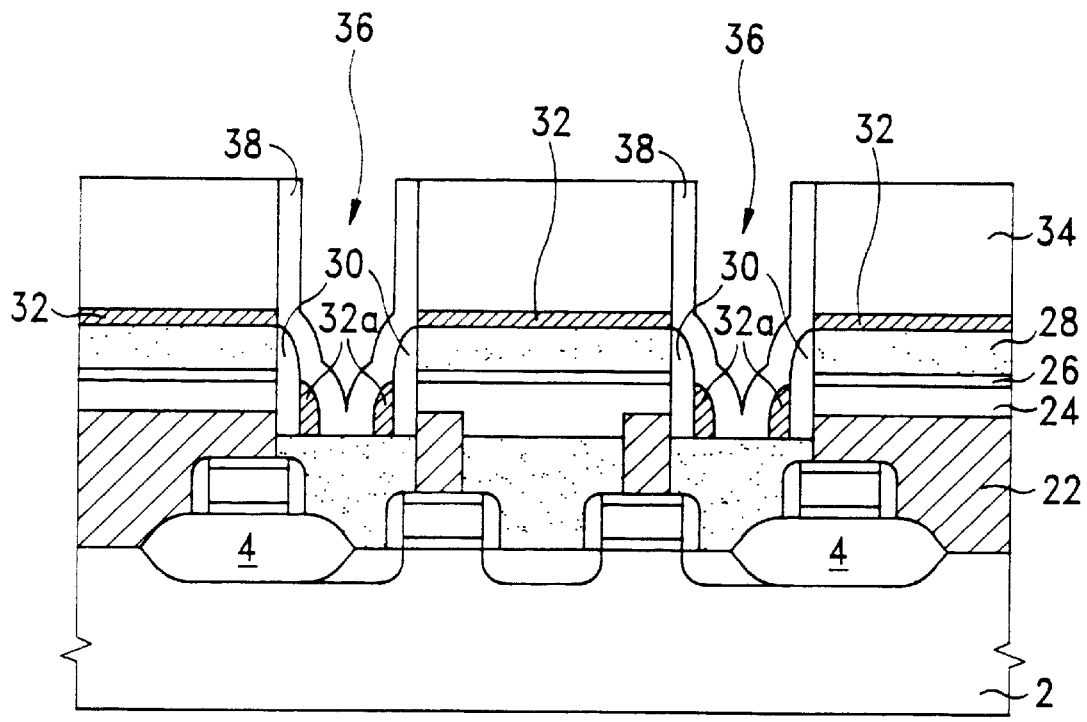
FIG. 7 is a cross sectional view of a semiconductor wafer illustrating the step of removing a top portion of the first conductive layer.

As shown in FIG. 7, an etching process is performed by using a photoresist as a mask to remove the top portion of the first conductive layer 38 on the dielectric layer 34. Preferably, the portion of the first conductive layer 38 is removed by chemical mechanical polishing (CMP).

Figure 8:
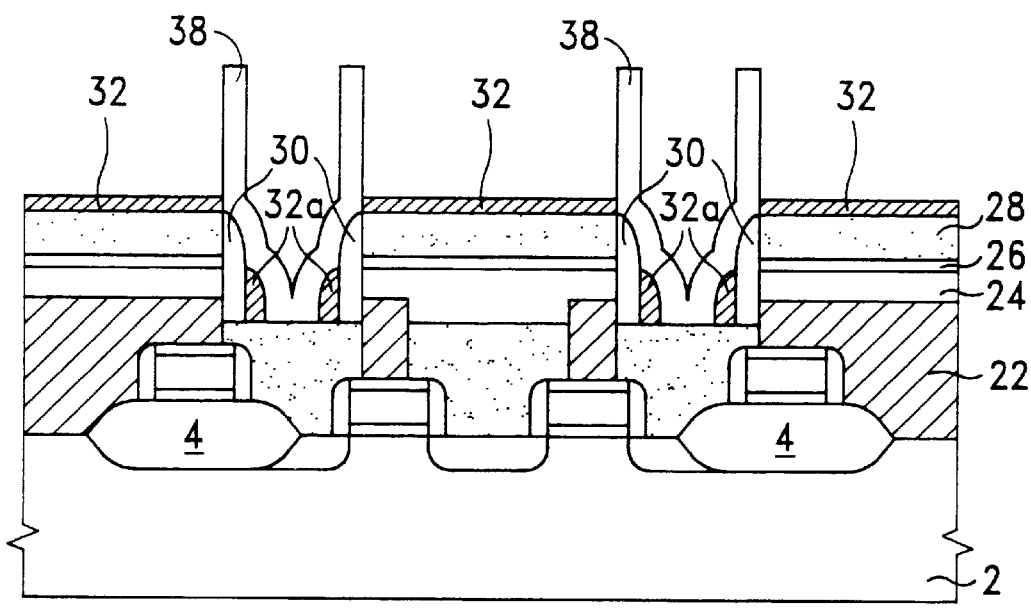
FIG. 8 is a cross sectional view of a semiconductor wafer illustrating the step of etching the oxide layer, thereby forming a first storage node having the crown shape.

Turning to FIG. 8, the dielectric (oxide) layer 34 is removed to expose the silicon nitride layer 30. Further, an etching with high selectivity between oxide and nitride is employed again. Alternatively, the oxide layer 34 can be removed by using diluted solution of hydrofluoric acid (HF) or buffered oxide-etching (BOE) solution or plasma etching back. After the procedure, a first storage node is formed with a crown shape.

Figure 9:
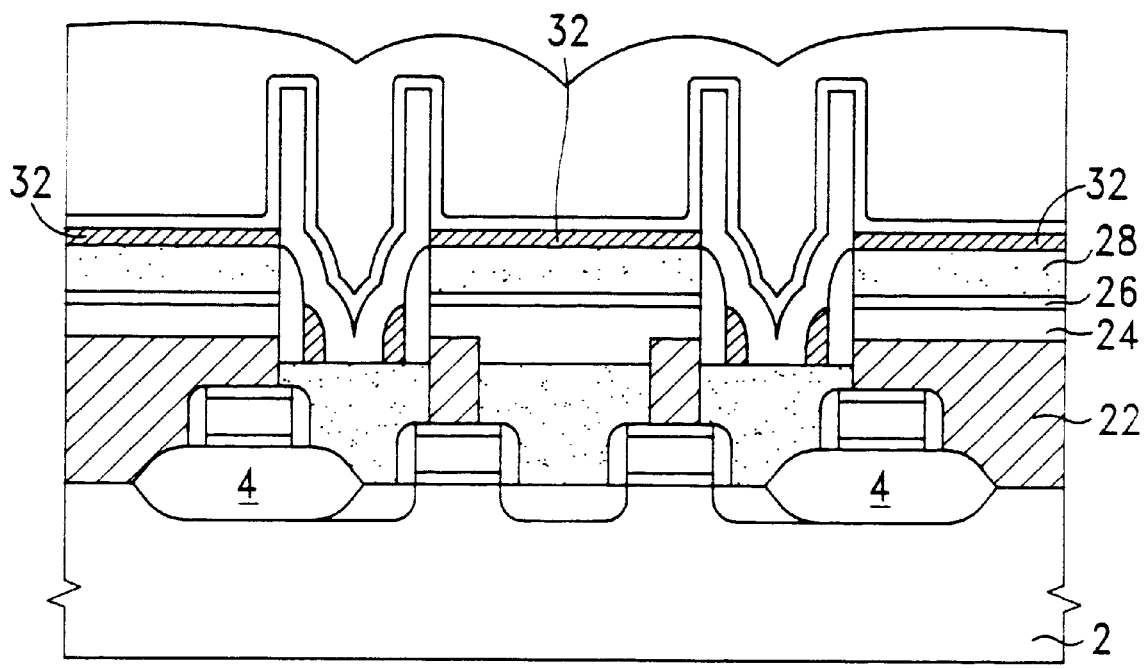
FIG. 9 is a cross sectional view of a semiconductor wafer illustrating the steps of forming a dielectric film and a second conductive layer.

Turning next to FIG. 9, a dielectric film 40 (no numbers on FIG. 9) is deposited along the surface of the first conductive layers 38 and silicon nitride layer 30. The dielectric film 40 is preferably formed of either a double film of nitride/oxide film, a triple film of oxide/nitride/oxide, or any other high dielectric film such as tantalum pentoxide (Ta2O5). Finally, as is shown in FIG. 9, a second conductive layer 42 is deposited using a conventional LPCVD process over the dielectric film 40. The second conductive layer 42 provides a further storage electrode and is formed of doped polysilicon, in situ doped polysilicon, aluminum, copper, tungsten, titanium or alloy. Thus, a semiconductor capacitor is formed which comprises a crown shape conductive structure 38 as its first storage electrode, a dielectric 40, and a conductive layer 42 as the second storage electrode.

The present invention thus provides capacitors with an enlarged surface area. The crown shaped structure increases the surface area of the capacitor. Therefore the present invention increases the performance of the capacitor. Moreover, the present invention uses the high etching selectivity between oxide and nitride to fabricate the capacitor.

As will be understood by persons skilled in the art, the foregoing preferred embodiment of the present invention is illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for manufacturing dynamic random access memory cells, the method comprising the steps of:

forming transistors and word lines on a semiconductor substrate;

forming a first isolation layer over the transistors;

forming polysilicon plugs in the first isolation layer over the transistors, the polysilicon plugs formed between said transistors and the word lines;

forming a polysilicon layer on the first isolation layer;

forming a cap layer over said polysilicon layer;

etching said cap layer, said polysilicon layer and said first isolation layer to expose the polysilicon plugs formed between the word lines and the transistors;

forming oxide spacers on sidewalls of the etched polysilicon layer and the etched cap layer;

forming a silicon nitride layer on the surface of the oxide spacers, the etched cap layer and the polysilicon plugs;

forming a second isolation layer on the silicon nitride layer;

etching the second isolation layer to form storage node contact holes over the polysilicon plugs formed between the transistors and the word lines;

etching the silicon nitride layer exposed by the storage node contact holes to form nitride spacers on the oxide spacers;

forming a first conductive layer on a surface of the storage node contact holes, and on the second isolation layer;

removing a portion of the first conductive layer on the second isolation layer;

removing the second isolation layer, thereby forming crown shaped first storage nodes;

forming a dielectric film on the surface of the crown shaped first storage nodes; and forming a second conductive layer over said dielectric film to act as a second storage node.

2. The method of claim 1, wherein said first isolation layer comprises TEOS-oxide.

3. The method of claim 1, wherein said first isolation layer comprises BPSG.

4. The method of claim 1, further comprising forming a tungsten silicide layer on said polysilicon layer after forming said polysilicon layer.

5. The method of claim 1, wherein said polysilicon layer comprises doped polysilicon.

6. The method of claim 1, wherein said polysilicon layer comprises in-situ doped polysilicon.

7. The method of claim 1, wherein said second isolation layer comprises oxide.

8. The method of claim 7, wherein said second isolation layer is removed by HF solution.

9. The method of claim 7, wherein said second isolation layer is removed by BOE solution.

10. The method of claim 7, wherein said second isolation layer is removed by plasma etching.

11. The method of claim 1, wherein said second isolation layer has a thickness in a range of about 10000 to 20000 angstroms.

12. The method of claim 1, wherein said first conductive layer is selected from the group consisting of doped polysilicon and in situ doped polysilicon.

13. The method of claim 1, wherein said top portion of said first conductive layer is removed by chemical vapor deposition.

14. The method of claim 1, wherein said top portion of said first conductive layer is removed by etching back process.

15. The method of claim 1, wherein said dielectric film is formed of tantalum oxide (Ta2O5).

16. The method of claim 1, wherein said dielectric film is formed of a triple film of oxide/nitride/oxide.

17. The method of claim 1, wherein said dielectric film is formed of a double film of nitride/oxide film.

18. The method of claim 1, wherein said second conductive layer is selected from the group consisting of doped polysilicon, in situ doped polysilicon, aluminum, copper, tungsten, titanium and the combinations thereof.

* * * * *